United States Patent [19]

Petrakov et al.

[11] Patent Number: 4,606,929
[45] Date of Patent: Aug. 19, 1986

[54] METHOD OF IONIZED-PLASMA SPRAYING AND APPARATUS FOR PERFORMING SAME

[76] Inventors: Vladimir P. Petrakov, ulitsa Sotsialisticheskaya, 27, kv. 2, Ufa; Gennady P. Minkin, ulitsa Trifonovskaya, 11, kv. 286, Moscow; Vladimir A. Shagun, ulitsa Musorgskogo, 19/1, kv. 52, Ufa; Pavel S. Balykin, ulitsa Entuziastov, 1, kv. 212, Ufa; David I. Barklon, ulitsa Kommunisticheskaya, 16, kv. 41, Ufa; Vladimir A. Domrachev, ulitsa Sotsialisticheskaya, 47, kv. 64, Ufa, all of U.S.S.R.

[21] Appl. No.: 769,889

[22] Filed: Aug. 27, 1985

[30] Foreign Application Priority Data

Dec. 20, 1984 [SU] U.S.S.R. ............... 3821669

[51] Int. Cl.$^4$ ............................................. B05D 1/08
[52] U.S. Cl. .................................... 427/34; 204/165; 219/121 PL
[58] Field of Search .................... 427/34, 38, 39; 204/165; 219/121 PL

[56] References Cited

U.S. PATENT DOCUMENTS

| | | | |
|---|---|---|---|
| 3,961,103 | 6/1976 | Aisenberg | 427/34 |
| 4,006,340 | 2/1977 | Gorinas | 427/34 |
| 4,328,257 | 5/1982 | Muehlberger et al. | 427/34 |
| 4,471,003 | 9/1984 | Cann | 427/34 |
| 4,475,032 | 10/1984 | Popma | 427/34 |
| 4,505,945 | 3/1985 | Dubust et al. | 427/34 |

OTHER PUBLICATIONS

"Elektronnaya Promyshlennost", magazine, 1980, No. 5, pp. 52-54, A. I. Belyakov, E. S. Privalov, A. A. Trunin, Apparatus for Deposition of Thin Layers of Aluminium and Its Alloys, (USSR and copy of English translation).

"Reviews of Electronics", Series: Technology and Management of Production and Plant, M. I. Berezin, Technology and Equipment for Applying Thin Films, Issue 9(30), Jun. 1972, SsNIIElektronika, Moscow, pp. 15-16, (USSR and copy of English translation).

"Elektronnaya Promyshlennost", (Electronics Industry Magazine), 1983, No. 5, N. S. Balakin, V. E. Minaichev, Oil-Free Cryogenic Pumping-Out System for Magnetron Spraying Unit, (USSR and copy of English translation).

Primary Examiner—John H. Newsome
Attorney, Agent, or Firm—Lilling & Greenspan

[57] ABSTRACT

The disclosed method of ionized-plasma spraying includes the steps of loading an article to be coated into a vacuum chamber, pumping out active gases from the vacuum chamber to a pre-evacuation level, cutting off the pre-evacuation pump, leaking an inert gas into the vacuum chamber, pumping out active gases from the vacuum chamber to the working pressure, spraying a coating onto the article in an inert gas atmosphere, and after the application of the coating terminating the pumping out of active gases from the vacuum chamber and leaking air thereinto, the subsequent pumping out of air from the vacuum chamber being effected to a pressure of 6 to 66 Pa.

The apparatus for perfoming the method comprises a high evacuation unit including a magnetron pump connected with the vacuum chamber through a cutoff valve and associated with means for monitoring the residual atmosphere.

4 Claims, 2 Drawing Figures

METHOD OF IONIZED-PLASMA SPRAYING AND APPARATUS FOR PERFORMING SAME

FIELD OF THE INVENTION

The present invention relates to technology of deposition in vacuum and more particularly it relates to a method of coating by ionized-plasma spraying and to an apparatus for performing this method.

INDUSTRIAL APPLICABILITY

The invention can be utilized to best advantage in vacuum deposition technologies, e.g. in coating by spraying, etching or melting various materials (conductive, current-resistive, dielectric, protective), when articles of complex compositions and with complicated coatings are processed. Articles processed or treated in an apparatus for ionized-plasma spraying in accordance with the present invention by the herein disclosed method can be widely used in electronics, metallurgy and optics.

DESCRIPTION OF THE PRIOR ART

When coatings are applied onto articles, the quality of the former is of essential importance, same as the productivity of the adopted technology, performance reliability of the apparatus used, susceptibility of the coatings being applied to quality monitoring and control. All these are dependent on the design of the apparatus and the selected method of processing.

There is known an apparatus for deposition in vacuum of thin films marketed by Denton Vacuum (cf. Reviews of Electronics, Series: Technology and Management of Production and Plant. Berezin M.I. Technology and Equipment for Applying Thin Films. Issue 9(30), June, 1972, TsNIIElektronika, Moscow—in Russian).

This known apparatus has three major components: an evacuation system with a mechanical pump and a diffusion one, a spraying chamber and a monitoring and control system. The mechanical pump is operated for pre-evacuation of the spraying chamber and for producing forevacuum at the output of the diffusion pump. The diffusion pump embodying the principle of diffusion of molecules of the gas being pumped out into the jet of vapor of a working fluid provides for evacuating the vacuum chamber to a rarefaction of $10^{-4}$–$10^{-6}$ Pa.

A serious drawback of this apparatus for deposition in vacuum is that oil molecules find their way into the vacuum chamber evacuated by the diffusion pump. Once in the processing space, the oil molecules settle on the substrate, thus contaminating the film of coating and hindering its adhesion to the article; moreover, when oil contacts the residual gas, it becomes oxidized and loses its evacuation properties. Furthermore, the operation of the diffusion pump involves preheating of the oil.

There is further known an apparatus for depositing thin films of aluminum and its alloys (cf. "Elektronnaya Promyshlennost" /Electronics Industry/ Magazine, 1980, No. 5, pp. 52-54—in Russian). The evacuation system of the apparatus, built about a diffusion pump with the mean operating rate (by air) of 10,000 l/s, provides for producing in the working chamber the residual pressure not lower than $6.6 \times 10^{-5}$ Pa in one hour. Initial evacuation is carried out with two mechanical pumps. Various means are incorporated to protect the working space from a reverse flow of oil vapors.

Among these means and measures is the use of oils with low resilience of their vapors in the mechanical and diffusion pumps, a nitrogen-filled trap with a 3-liter working volume built into the fore-line, and a freezing herringbone-type trap of a 6-liter volume with automatic supply of liquid nitrogen, included intermediate the diffusion pump and the high-vacuum cutoff gate. Pre-evacuation of the vacuum chamber from air is conducted in two stages, viz. to the residual pressure of 66.5–13.3 Pa with the mechanical pumps (with the stream of air being pumped out resisting the ingress of oil vapors from the fore-line into the working chamber); and through the $(13.3-1.3) \times 10^{-1}$ Pa range with the diffusion pump through a bypass line. The final pumping out is then carried out with the high-vacuum gate open and the bypass line valve closed.

The process of coating by deposition in vacuum is performed, as follows.

Substrates are loaded into the vacuum chamber, the diffusion pump is heated up, air is pumped from the vacuum chamber, the substrates are heated, and spraying is effected.

Among the shortcomings of this apparatus are ingress of oil molecules into the evacuated vacuum chamber, a considerable time (about one hour) required for arriving at the working vacuum ($10^{-5}$ Pa), the complicated system of protecting the working chamber against the reverse flow of oil vapors, involving a considerable input of liquid nitrogen. The relatively low throughput of the apparatus is also its essential disadvantage.

The closest prior art of the present invention by its technical essence is the method of ionized-plasma spraying and the apparatus for ionized-plasma spraying (cf. "Elektronnaya Promyshlennost" /Electronics Industry/ Magazine, 1983, No. 5, pp. 50-52—in Russian).

The ionized-plasma spraying apparatus includes a vacuum chamber communicating with leaks for argon and air and accommodating thereinside four cylindrical chambers and ionized-plasma spraying sources. Connected to the vacuum chamber is a high evacuation unit comprising a mechanical pump, a cryogenic pump and an auxiliary magnetron pump, the argon leak being also connected to the vacuum chamber. The method of ionized-plasma spraying is performed in this apparatus, as follows.

An article or articles to be coated are loaded into one of the four cylindrical chambers. Active gases are pumped out from the vacuum chamber by the mechanical and cryogenic pumps to the pressure of $6 \times 10^{-4}$ Pa, whereafter the mechanical pump is turned off, and the auxiliary magnetron pump is activated. Then argon is leaked into the vacuum chamber to the pressure of $5 \times 10^{-1}$ Pa, and spraying is performed. The required pressure of the working gas (argon) is maintained throughout the spraying process by operating the argon leaks.

Among the shortcomings of this apparatus of the prior art and of the method of ionized-plasma spraying performed therein are the complexity and bulk of the structure, the prolonged time of pumping out the active gases from the vacuum chamber and difficulties encountered in maintaining the required argon pressure in the vacuum chamber on account of the necessity of having the prolonged operation of the mechanical pump and continuous operation of the cryogenic pump which is the main source of producing the high vacuum that has to be kept up; to say nothing of the complicated character of replacement and repairs of the components of the apparatus, and of monitoring the quality of sprayed coatings. The abovementioned drawbacks result in a relatively low productivity of the apparatus and inadequate quality of deposited coatings.

SUMMARY OF THE INVENTION

It is an object of the present invention to create a method of ionized-plasma spraying and an apparatus for performing this method, providing for a high efficiency of application of coatings and an enhanced quality of the coatings.

It is another object of the present invention to provide for monitoring the purity of the inert gas (argon) in the course of magnetron-initiated high-frequency cleaning and coating of articles.

It is yet another object of the present invention to simplify the structure of the apparatus.

These and other objects are attained in a method of ionized-plasma spraying, including the steps of loading an article into the vacuum chamber, pumping out active gases from the vacuum chamber to a pre-evacuation level, cutting off the pre-evacuation pump, pumping out active gases from the vacuum chamber to the working vacuum level, and spraying a coating onto the article in an inert gas atmosphere, in which method, according to the invention, the leaking-in of an inert gas is effected before pumping out the active gases from the vacuum chamber to the working vacuum level; after the spraying of the coating onto the article the pumping out of the active gases from the vacuum chamber is discontinued, and air is leaked thereinto, the successive evacuation of air from the vacuum chamber being effected to a pressure of 6 to 66 Pa.

These and other objects are also attained in an apparatus for performing the method of ionized-plasma spraying, comprising a vacuum chamber accommodating the rein an ionized-plasma source and means for accommodating an article, a pre-evacuation pump connected to the vacuum chamber through a cutoff valve, a high evacuation unit including a magnetron pump connected with the vacuum chamber, a leak for letting air into the vacuum chamber and an inert gas leak connected to the magnetron pump, in which apparatus, according to the invention, the magnetron pump is connected to the vacuum chamber through an additional cutoff valve, the magnetron pump being associated with means for monitoring the residual atmosphere.

It is expedient that the vacuum chamber should accommodate a system for high-frequency precleaning of the articles. It is further expedient that the vacuum chamber should accommodate a system for heating the articles.

The herein disclosed method allows for facilitating the starting of the magnetron pump, saving the inert gas, raising the starting pressure of the magnetron pump, having a higher rate of pumping out active gases at considerable gas loads, and fine selectivity between pumping out active gases and inert ones. Furthermore, prolonged service life of the magnetron pump is provided for, with reliability and convenience of its operation.

The implementation of the herein disclosed method provides for maintaining the started or activated state of the magnetron pump and having a high rate of evacuation of the vacuum chamber with the minimized time of activation of the mechanical pump.

The magnetron pump being incorporated in the high evacuation unit enables to raise the starting pressure of the pump, provides for a high rate of the pumping out of active gases, for maintaining these high rates of the pumping out at considerable gas loads, and for fine selectivity between pumping out inert gases and active ones. A magnetron pump offers a prolonged service life and is reliable and easy to operate.

The magnetron pump being connected with the vacuum chamber through a cutoff valve provides for maintaining the activated state of the magnetron pump and having a high rate of the pumping out of active gases from the vacuum chamber, while prolonging the service life of both pumps, i.e. of the magnetron and mechanical ones.

The inert gas leak being connected to the housing of the magnetron pump facilitates the starting of the magnetron pump and provides for saving the inert gas.

The magnetron pump being associated with the means for monitoring the residual atmosphere allows for determining the moment when the active gases have been sufficiently pumped out and for controlling their leaking in the process of the spraying of a coating.

The vacuum chamber of the herein disclosed apparatus accommodating the system of high-frequency magnetron cleaning of articles provides for performing the cleaning in a single process, which steps up the productivity and enhances the quality of sprayed coatings.

The vacuum system accommodating the system for heating the articles to be coated provides for their quicker degassing and enhances the coating quality.

SUMMARY OF THE APPENDED DRAWINGS

The invention will be further described in connection with embodiments thereof, with reference being made to the accompanying drawings, wherein:

FIG. 1 schematically illustrates an ionized-plasma spraying apparatus embodying the invention;

FIG. 2 is a sectional view taken on line II—II of FIG. 1.

DESCRIPTION OF PREFERRED EMBODIMENT OF THE INVENTION

Figure 1:
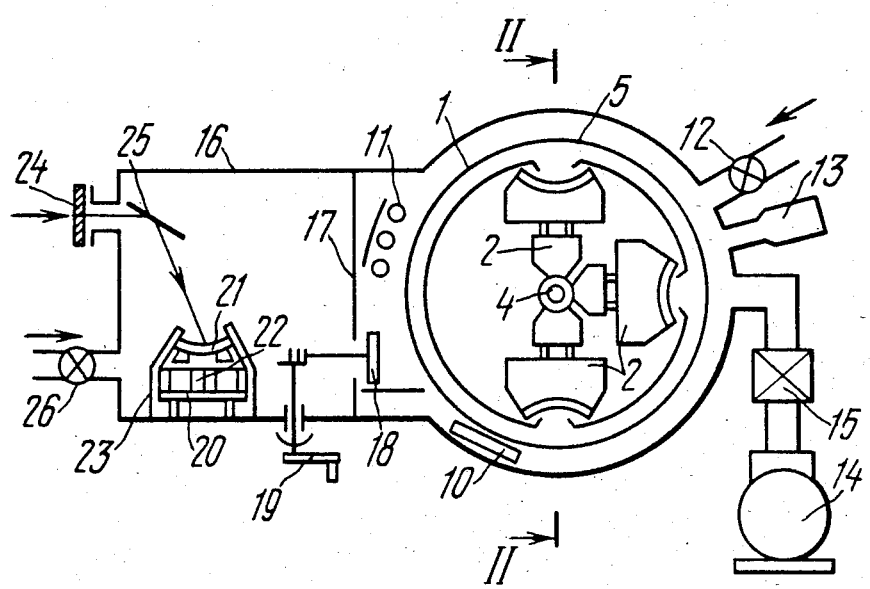
Figure 2:
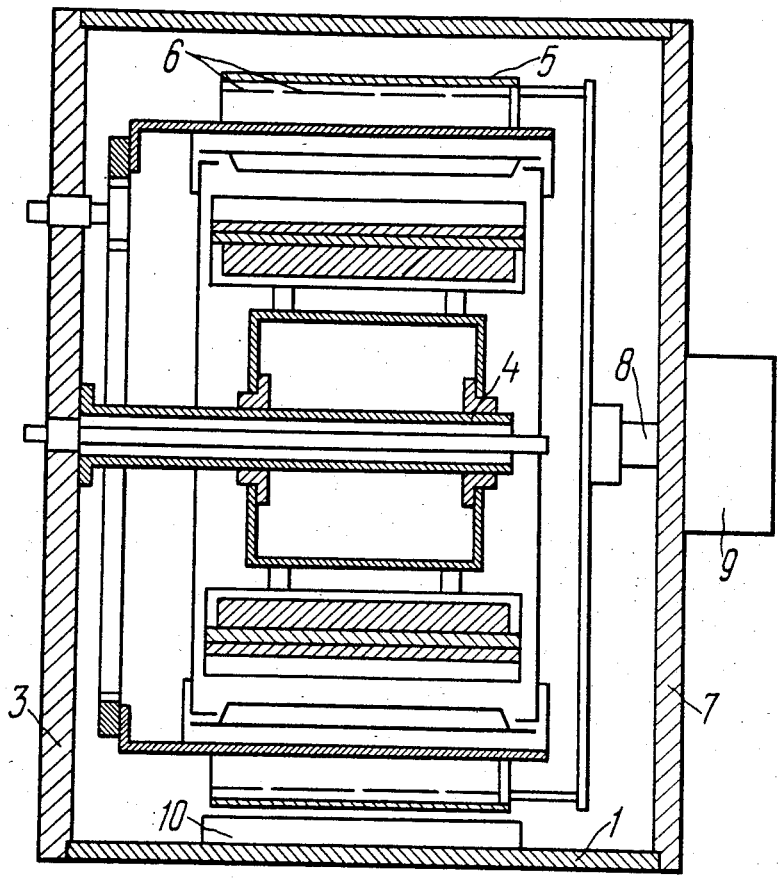

The apparatus for ionized-plasma spraying, embodying the invention, comprises a vacuum chamber 1 (FIGS. 1 and 2) accommodating therein ionized-plasma spraying sources 2 mounted on the rear cover 3 of the vacuum chamber 1 with aid of a shaft 4. The vacuum chamber 1 further accommodates means for positioning articles to be coated, including a drum 5 coaxially received in this vacuum chamber 1 and having the articles 6 to be coated by spraying attached thereto. The drum 5 is mounted on the front cover 7 of the vacuum chamber 1 with aid of a shaft 8 and is operatively connected to a drive 9. The space intermediate the drum 5 and the adjacent walls of the vacuum chamber 1 accommodates a system 10 for high-frequency magnetron initiated cleaning of articles to be coated, and a system 11 for heating these articles. The system 10 for high-frequency cleaning of articles to be coated is in the form of a magnetron whose targets are the articles to be coated attached to the drum 5. The magnetron is supplied from a high-frequency (microwave) voltage generator (not shown in the drawings).

The system 11 for heating the articles to be coated is a conventional lamp-type heater supplied from a d.c. source (not shown, either).

The vacuum chamber 1 communicates with a leak 12 for leaking-in air, with a thermocouple pressure gauge 13, and with a pre-evacuation pump 14 through a cutoff valve 15 of this pump 14.

The vacuum chamber 1 further has connected thereto a high evacuation unit incorporating a magnetron pump 16, a baffle 17 with a cutoff valve 18 movable by an actuator 19 being mounted in the connection of the magnetron pump 16.

The housing of the magnetron pump 16 (FIG. 1) accommodates a magnetron 20 with a titanium targer 21 acting as the cathode, a permanent magnet system 22 and an anode 23, and also a device 24 for monitoring the residual atmosphere, including a mirror system 25.

The mirror system 25 includes mirrors (not shown in the drawing) registering the incidence and reflection of the color of the plasma. The image reflected by the mirror system 25, i.e. the color of the plasma, is directed into a viewing device. The mirrors of the system are protected from being coated with a layer of dust. The magnetron pump 16 communicates with an inert gas leak 26.

The method of ionized-plasma spraying is conducted in the abovedescribed apparatus for ionized-plasma spraying, as follows.

The front cover 7 (FIG. 1) of the vacuum chamber 1 is opened, and articles 6 to be coated are positioned on the drum 5, whereafter the cover 7 is closed once again. Air is pumped out from the vacuum chamber 1 and from the magnetron pump 16 in the following sequence: the pre-evacuation pump is turned on, the cutoff valve 15 of the pre-evacuation pump 14 is opened, and the actuator 19 is operated to open the cutoff valve 18 of the magnetron pump. The leak 12 for air and the leak 26 for the inert gas are closed before the pre-evacuation pump 14 is turned on. With the pressure in the vacuum chamber 1 having been reduced to about 0.3–1.0 Pa, the cutoff valve 15 of the pre-evacuation pump 14 is closed, the last-mentioned pump 14 is turned off, and the inert gas leak 26 is operated to leak in the inert gas to a 1–10 Pa pressure, whereafter the inert gas leak 26 is closed. The pressure inside the vacuum chamber 1 is read by the thermocouple gauge 13. The actuator 19 is operated to close the cutoff valve 18 of the magnetron pump. Working voltage is fed to the magnetron 20 with the titanium targer 21, and discharge current of 1.0–1.2 A is set. The magnetron 20 operates as follows. When negative potential is fed to the targer 21 acting as the cathode relative to the anode 23, a zone with crossed non-uniform electric and magnetic fields is produced in the area adjoining the cathode 21. Electrons appearing in this zone are driven by the crossed fields (the magnetic field produced by the permanent magnet system 22 and the electric field generated between the titanium targer 21 and the anode 23) through complex movements and are engaged in repeated hard (ionizing) collisions with molecules of the inert gas (argon). As a result, an annular zone of ionized plasma is produced above the surface of the titanium targer 21. Positive ions yielded by the discharge are accelerated toward the titanium target 21 and bombard its surface in the erosion zone, striking out titanium particles which, as chemically active ones, link up irreversibly with molecules of residual gases ($O_2$, $N_2$, $H_2$, $H_2O$, $CO$, $CO_2$, etc.), forming oxides, carbides, hydrides, nitrides and the like which settle on the water-cooled chamber of the magnetron pump 16. The phenomenon of linking up of the released titanium particles with molecules of residual gases and their deposition on the water-cooled walls of the chamber of the magnetron pump 16 ensures that in 30–40 minutes all the gases save the inert gas (argon) are exhausted, which creates particularly favorable conditions for ionized-plasma spraying of coatings onto articles. The moment when all the gases save the inert argon have been exhausted is heralded by the device 24 for monitoring the residual atmosphere as the onset of greenish-blue glow of plasma above the surface of the titanium target 21. The cutoff valve 18 of the magnetron pump 16 is opened by the actuator 19, whereby the pressure in the vacuum chamber 1 and in the magnetron pump 16 is levelled out, and residual gases are exhausted from the vacuum chamber 1. The moment the cutoff valve 18 of the magnetron pump 16 is opened, the glow above the surface of the titanium target 21 turns violet-red, and in 5–6 minutes its greenish-blue hue is resotored. The greenish-blue glow of the plasma indicates that active gases save the inert gas (argon) have been fully exhausted from the vacuum chamber 1. At this stage it is practical to lower the discharge current to 0.2–0.3 A to economize the consumption of the material of the titanium target 21. With the inert gas (argon) being introduced into the magnetron pump 16, a high rate of titanium sputtering is ensured. The spacing of the surface of the titanium target 21 from the walls of the magnetron pump 16 being several times higher than the length of the free run of sputtered titanium particles provides for a high probability of collision of titanium particles with molecules of the residual gases and supports high exhaust rates up to 30,000 l/s. The working voltage of the magnetron 20 with the titanium target 21 is held at 400–500 V, which precludes a phenomenon of exhaustion of argon by its invading the material of the titanium target 21. The titanium targer 21 and the walls of the housing of the magnetron pump 16 being water-cooled prevents their oveheating and release of gases at high rates of titanium sputtering, which provides for stable performance of the magnetron 20 at high gas loads. With the residual gases exhausted from the vacuum chamber 1, the pressure the rein drops to 0.05–0.1 Pa, and the inert gas leak 26 is operated to leak in the inert gas (argon) to a working pressure of 0.1–1.0 Pa. The drive 9 is operated to revolve the drum 5 on the shaft 8. The article-heating system 11 is turned on. The articles 6 are cleaned by the high-frequency magnetron-initiating cleaning system 10 for 5–10 minutes, and then the ionized-plasma spraying sources 2 are operated to apply coatings onto the articles 6.

With the articles 6 coated, the actuator 19 is operated to close the cutoff valve 16 of the magnetron pump 16. The vacuum chamber 1 is unsealed by leaking-in air through the leak 12, the magnetron 20 is turned off, and the articles 6 are removed. In the course of subsequent cycles of coating by spraying, pre-evacuation of the magnetron pump 16 is required only when the titanium target 21 has to be replaced, the magnetron pump 16 becomes unsealed, or in other emergency cases. With the starting state of the magnetron pump 16 being maintained, prompt complete evacuation of the working vacuum chamber 1 ca be accomplished in 5–6 minutes following the operation of the pre-evacuation pump 14 for 3–5 minutes required for reducing the pressure in the vacuum chamber 1 to 6–66 Pa.

Should the pre-evacuation pump 14 which is generally a mechanical pump be operated for more than 10 minutes and should the pressure in the vacuum chamber 1 be consequently reduced to a value below 6 Pa, it is possible that oil from the mechanical pump would find its way into the vacuum chamber 1 and affect the coating quality. On the other hand, should the cutoff valve 18 of the magnetron pump 16 be opened when the vacuum chamber 1 is evacuated to a pressure in excess of 66 Pa, this might affect the working duty of the magnetron 20, leading to a reduced pumping-out rate of the magnetron 16 and excessive consumption of the material of the titanium target 21.

It can be seen from the abovesaid that implementation of the disclosed method of ionized-plasma spraying in an apparatus for ionized-plasma spraying embodying the present invention provides for attaining high rates of pumping out active gases, maintains the high pumping-out rates at considerable gas loads and also allows for high selectivity in pumping out active gases and inert gases.

Furthermore, implementation of the disclosed method of ionized-plasma sprayed in an apparatus embodying the present invention allows for attaining a high quality of coatings applied onto articles with a high productivity, prolonged service life of the pumping-out means, reliable performance and ease of operation.

We claim:

1. A method of ionized-plasma spraying, including the steps of loading an article into a vacuum chamber; pumping out active gases from said vacuum chamber to a pre-evacuation level; cutting off the pump having been operated for the pre-evacuation; leaking an inert gas into said vacuum chamber; pumping out active gases from said vacuum chamber to attain the working pressure; spraying a coating onto said article in the inert gas atmosphere, and after the application of the coating onto said article terminating the pumping out of active gases from said vacuum chamber and leaking air thereinto, the subsequent evacuation of air from said vacuum chamber being effected to a pressure of 6 to 66 Pa.

2. An apparatus for performing a method of ionized-plasma spraying, comprising a vacuum chamber; at least one source of ionized-plasma spraying, accommodated in said vacuum chamber; means for accommodating articles to be coated, received within said vacuum chamber; a pre-evacuation pump connected to said vacuum chamber through a cutoff valve; a high evacuation unit including a magnetron pump connected with said vacuum chamber through another cutoff valve; a leak for letting air into said vacuum chamber; an inert gas leak connected to said magnetron pump, said magnetron pump being associated with means for monitoring the residual atmosphere.

3. An apparatus as set forth in claim 2, comprising a system for high-frequency cleaning of the articles to be coated, accommodated in said vacuum chamber.

4. An apparatus as set forth in claim 2, comprising a system for heating the articles to be coated, accommodated in said vacuum chamber.

* * * * *